United States Patent
Park

(10) Patent No.: US 7,932,147 B2
(45) Date of Patent: Apr. 26, 2011

(54) FLASH MEMORY DEVICE AND MANUFACTURING METHOD OF THE SAME

(75) Inventor: Jin-Ha Park, Icheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/627,923

(22) Filed: Nov. 30, 2009

(65) Prior Publication Data

US 2010/0155820 A1    Jun. 24, 2010

(30) Foreign Application Priority Data

Dec. 24, 2008  (KR) ................. 10-2008-0132766

(51) Int. Cl.
*H01L 21/336* (2006.01)

(52) U.S. Cl. ........ 438/258; 438/400; 438/238; 438/239; 438/386; 438/389; 257/324; 257/E21.679; 257/E27.103; 257/295; 257/296; 257/314; 257/E21.209

(58) Field of Classification Search .................. 438/400, 438/258, 238–239, 386, 389; 257/324, E21.679, 257/E27.103, 295, 296, 314, E21.209
See application file for complete search history.

(56) References Cited

U.S. PATENT DOCUMENTS

| | | | | |
|---|---|---|---|---|
| 5,940,718 A | * | 8/1999 | Ibok et al. | 438/440 |
| 6,174,787 B1 | * | 1/2001 | Fuller et al. | 438/440 |
| 6,243,293 B1 | * | 6/2001 | Van Houdt et al. | 365/185.14 |
| 7,061,040 B2 | * | 6/2006 | Shih | 257/314 |
| 7,075,142 B2 | * | 7/2006 | Sim et al. | 257/316 |
| 7,452,763 B1 | * | 11/2008 | Yu | 438/186 |
| 7,482,653 B2 | * | 1/2009 | Sandhu et al. | 257/315 |
| 7,544,565 B2 | * | 6/2009 | Kwak et al. | 438/257 |
| 2003/0100172 A1 | * | 5/2003 | Kim et al. | 438/585 |
| 2004/0005764 A1 | * | 1/2004 | Wu et al. | 438/400 |
| 2004/0070023 A1 | * | 4/2004 | Kim et al. | 257/315 |
| 2005/0074940 A1 | * | 4/2005 | Jung et al. | 438/300 |
| 2005/0285177 A1 | * | 12/2005 | Shone | 257/315 |
| 2006/0160308 A1 | * | 7/2006 | Kim | 438/261 |
| 2007/0267692 A1 | * | 11/2007 | Joo et al. | 257/330 |
| 2009/0140378 A1 | * | 6/2009 | Kim | 257/508 |
| 2009/0148990 A1 | * | 6/2009 | Kim | 438/266 |
| 2009/0236651 A1 | * | 9/2009 | Kwak et al. | 257/315 |
| 2009/0294837 A1 | * | 12/2009 | Lee et al. | 257/324 |
| 2010/0127324 A1 | * | 5/2010 | Hsieh | 257/334 |

* cited by examiner

*Primary Examiner* — N Drew Richards
*Assistant Examiner* — Ankush K Singal
(74) *Attorney, Agent, or Firm* — Sherr & Vaughn, PLLC

(57) ABSTRACT

A flash memory device may include a device isolation layer and an active area formed over a semiconductor substrate, a memory gate formed over the active area, and a control gate formed over the semiconductor substrate including the memory gate, wherein the active area, where a source contact is to be formed, has the same interval spacing as a bit line, and a common source line area, where the source contact is to be formed, has an impurity area connecting neighboring active areas.

20 Claims, 7 Drawing Sheets

FLASH MEMORY DEVICE AND MANUFACTURING METHOD OF THE SAME

The present application claims priority under 35 U.S.C. 119 to Korean Patent Application No. 10-2008-0132766 (filed on Dec. 24, 2008), which is hereby incorporated by reference in its entirety.

BACKGROUND

A flash memory device is a nonvolatile memory medium. Stored data is not lost even when the power supply is turned off. Flash memory has a relatively high data processing speed for recording, reading, and erasing. Accordingly, the flash memory device may be used for a BIOS in a PC, and for storing data in a set-top box, a printer, and a network server, etc. Flash memory may also be used in digital cameras and cellular phones, etc.

In a flash memory device, a stack gate type semiconductor device using a floating gate, and a silicon-oxide-nitride-oxide silicon (SONOS) structure are used. Flash memory devices can be competitive only when unit cells are concentrated on a narrow area, using a common source line rather than a separate contact on each source. A common source line is formed to be larger than a bit line. This affects the formation of adjacent bit lines, due to lines having irregular sizes, thereby creating a difficulty in forming a uniform pattern.

SUMMARY

Embodiments relate to a flash memory device, which may include: A flash memory device may include a device isolation layer and an active area formed over a semiconductor substrate, a memory gate formed over the active area, and a control gate formed over the semiconductor substrate including the memory gate, wherein the active area, where a source contact is to be formed, has the same interval spacing as a bit line, and a common source line area, where the source contact is to be formed, has an impurity area connecting neighboring active areas.

Embodiments relate to a manufacturing method of a flash memory device which may include: forming a trench on a semiconductor substrate, forming an impurity area in the trench formed between areas where a source contact is to be formed, forming an active area by forming a device isolation layer by burying insulating material into the trench, and forming a memory gate and a control gate over the device isolation layer, wherein the active area where a source contact is to be formed has the same spacing interval as a bit line, and the impurity area connects the neighboring active areas where the source contact is formed.

DRAWINGS

Example FIGS. 1 to 5 are process plan views and cross-sectional views of a flash memory device according to embodiments.

Example FIGS. 6 to 12 are plan views and cross-sectional views of the flash memory device in a state where a drain contact and a source contact are formed.

DESCRIPTION

Example FIGS. 1 to 5 are process plan views and cross-sectional views of a flash memory device according to embodiments.

Figure 1:
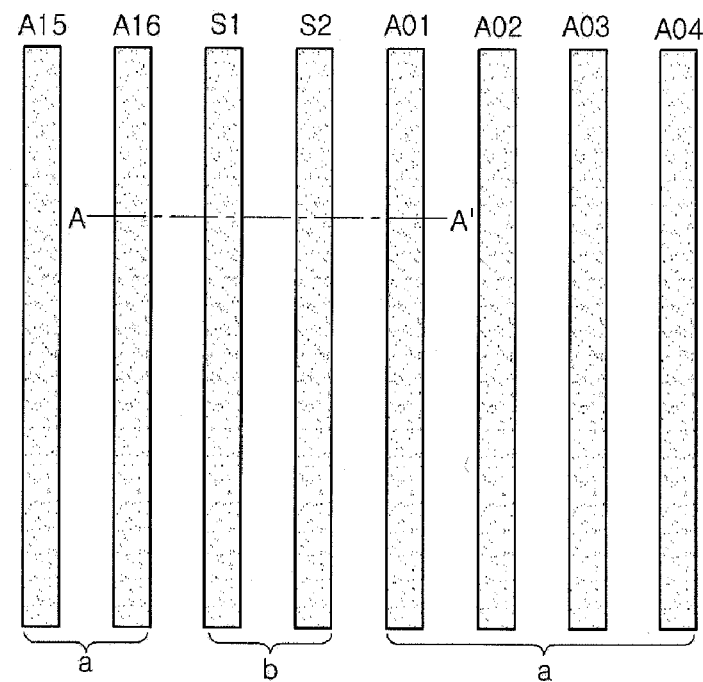
Figure 2:
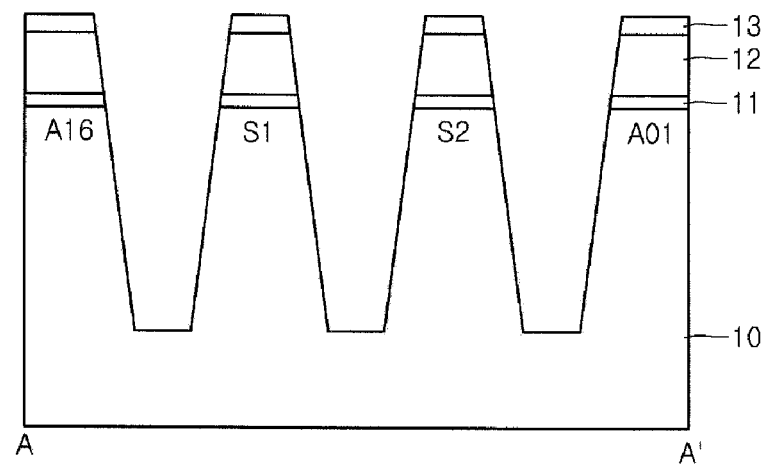

Example FIG. 2 is a cross-sectional view taken along lines A-A' of example FIG. 1. As shown in example FIGS. 1 and 2, at least one trench 5 (shown in example FIG. 2 as a plurality of trenches; hereinafter referred to as simply "trench 5") may be formed in a semiconductor substrate 10. The trench 5 may be formed by forming a first pad oxide layer pattern 11, a pad nitride layer pattern 12, and a second pad oxide layer pattern 13 over the semiconductor substrate 10 and then performing an etching process thereon using them as a mask.

The trench 5 may thereafter be buried with insulating material to form a device isolation layer. The device isolation layer may be used to define an active area. Trench 5, a source active area (b) where a source contact is to be formed, and a cell active area (a) may all be formed having the same interval, or in other words, spaced evenly. Because the trench 5 and the active area are formed in the same interval, it is possible to minimize the effects of interference during the photolithography process for forming the trench 5.

Moreover, since all the cells have the same size and shape, it is possible to minimize the distribution of the threshold voltage Vth generated during the program and erase operation of the flash memory device. If the distribution of the threshold voltage as above is minimized, it may be possible to manufacture a multi level cell (MLC) dividing a threshold voltage section into several sections with a single cell.

Figure 3:
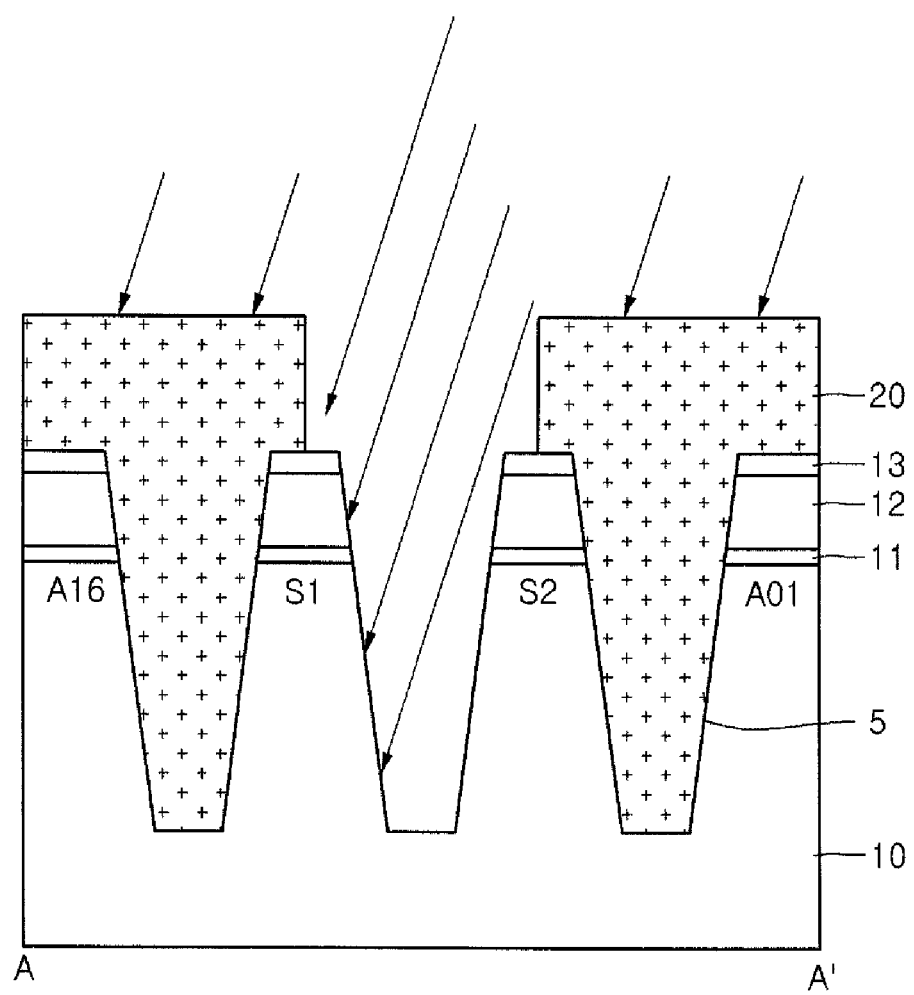
Figure 4:
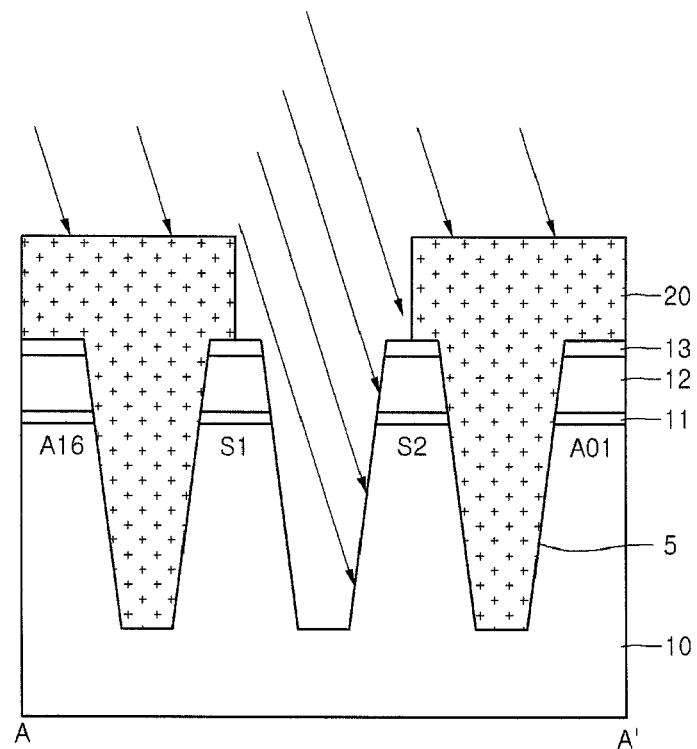
Figure 5:
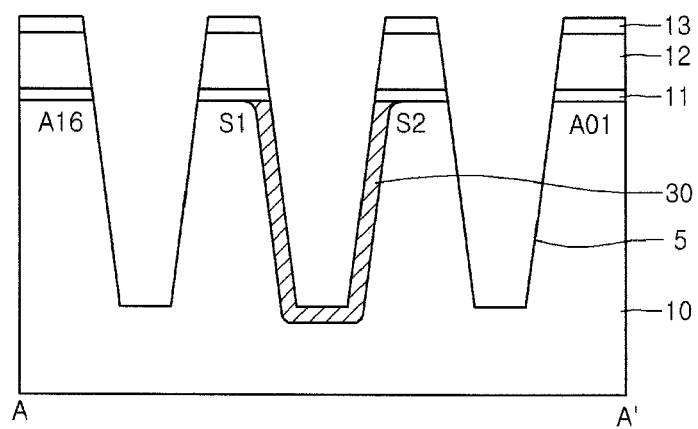

As shown in example FIG. 3, a photoresist pattern 20 may be formed over the semiconductor substrate 10. Then, a first ion implantation process may be performed. The photoresist pattern 20 may be open only in the source active area (b) where the source contact is to be formed, and may cover the cell active area (a).

The first ion implantation process may be performed by implanting V family based arsenic or phosphorus ions at an energy of 1 KeV to 100 KeV, with ion doses ranging from $1 \times 10^{13}$ to $1 \times 10^{16}$ ion/cm$^2$, and at an angle of 0° to 30°. The first ion implantation process may be performed at a predetermined angle to allow ions to be implanted into only a predetermined portion of the trench 5, so that after rotating the semiconductor substrate 10, a second ion implantation process may be performed as shown, in example FIG. 4.

Using the same conditions as the first ion implantation process, the second ion implantation process may also be performed by implanting V family based arsenic or phosphorus ions at an energy of 1 Key to 100 KeV with ion doses ranging from $1 \times 10^{13}$ to $1 \times 10^{16}$ ion/cm$^2$ at an angle of 0° to 30°. The trench 5, in the area where a source contact is to be formed, may form a uniformly coated first impurity area 30 through the two ion implantation processes, as shown in example FIG. 5. In this way, the first impurity area 30 may be made substantially uniform along the side walls and the bottom surface of the trench 5.

Therefore, the first source active area S1 and the second source active area S2 of the source active area b may be electrically connected to each other by the first impurity area 30. In embodiments, although the first impurity area 30 is formed in only one trench disposed between the two active areas, embodiments are not limited thereto. The first impurity area 30 may be formed in at least one trench so that at least two active areas may be electrically connected to each other.

The first pad oxide layer pattern 11, the pad nitride layer pattern 12, and the second pad oxide layer pattern 13 may be removed. The trench 5 may be buried with insulating material, thereby making it possible to form the device isolation layer. Moreover, the flash memory device can be formed by sequentially forming a floating gate, a dielectric layer, and a control gate over the semiconductor substrate 10.

Example FIGS. 6 to 11 are plan views and cross-sectional views of the flash memory device in a state where a drain contact and a source contact are formed. First, as shown in example FIG. 6, the source contact 45a may be formed on the same line as the drain contact 45b, which is a bit line contact, having the same size. In other words, the size of the first source active area S1 is the same as that of the second source active area S2, so that the source contact 45a may be formed having the same size as the drain contact 45b.

Since the source contact 45a and the drain contact 45b are formed in the same size, they do not interfere with a contact when forming a M1C, which is a metal line on an upper portion, so that the patterning of the metal line can also be easily implemented.

Figure 6:
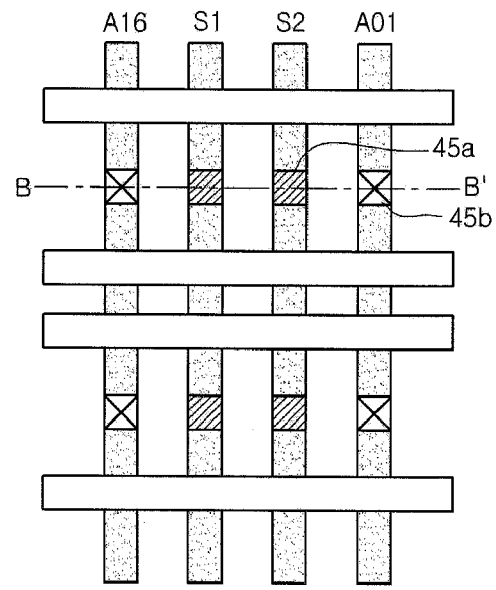
Figure 7:
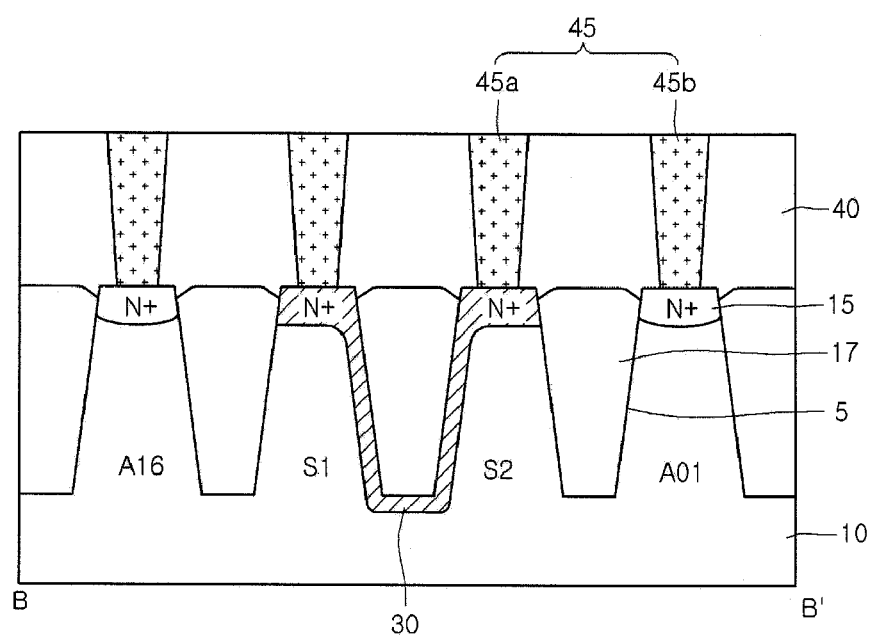

Example FIG. 7 is a cross-sectional view taken along lines B-B' of the flash memory device of FIG. 6. Insulating material 17 may be formed inside the trench 5. A second impurity area 15 may be formed in the first source active area S1, the second source active area S2, and a first cell active area A01 of the cell active area a. The second impurity area 15 may be formed to set the threshold voltage of the floating gate. An interlayer dielectric layer 40, in which the source contact 45a and the drain contact 45b are formed, is disposed over the semiconductor substrate 10.

Figure 8:
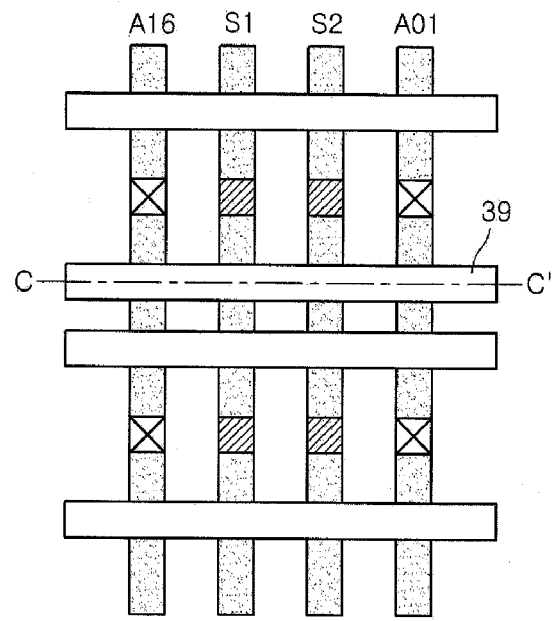
Figure 9:
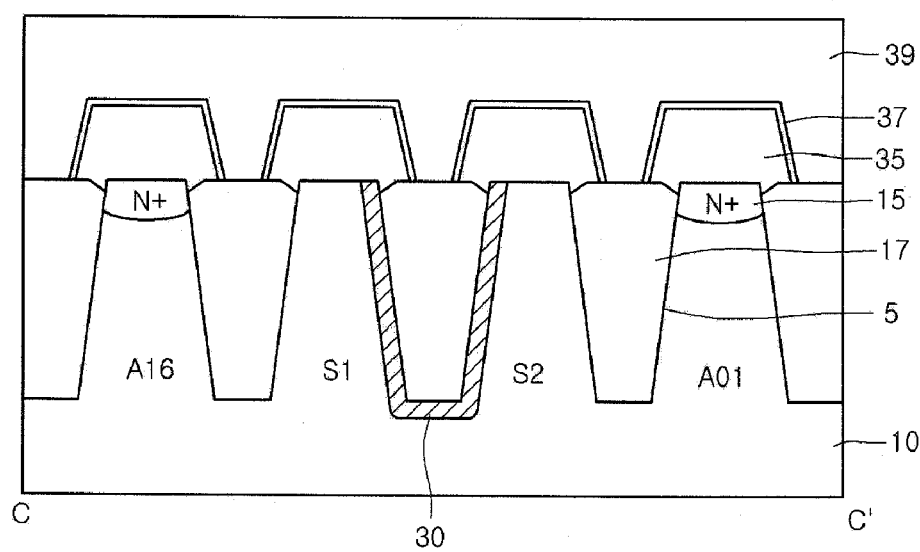

Example FIG. 9 is a cross-sectional view taken along lines c-c' of example FIG. 8. As shown in example FIGS. 8 and 9, a floating gate 35, a dielectric layer 37, and a control gate 39, which is a word line, are disposed over the semiconductor substrate 10. The source contact 45a and the drain contact 45b are formed to be the same size, so that the control gate 39 may be formed in a straight line shape, crossing the active area. In other words, the control gate 39 is formed in a straight line, without any curves, so that it can be easily implemented, and can be formed in parallel with the neighboring control gate 39

Figure 10:
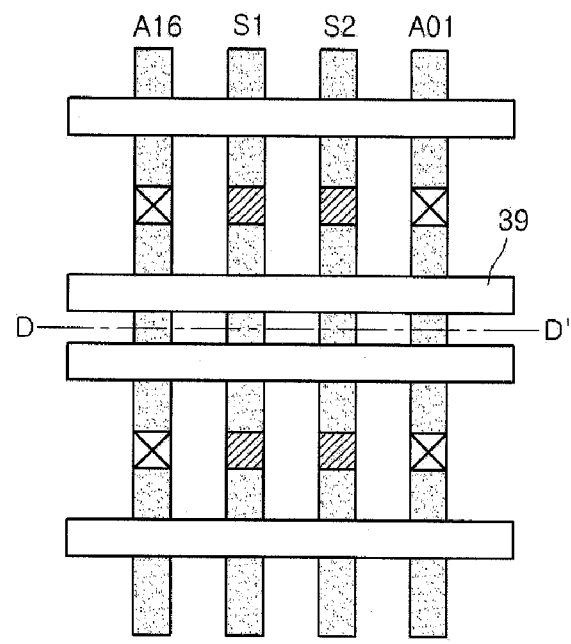
Figure 11:
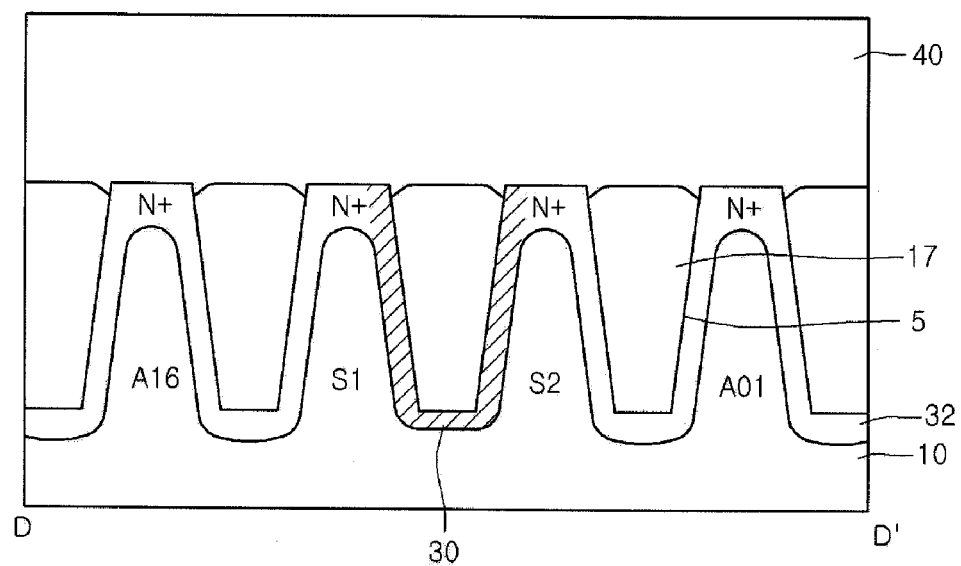

Example FIG. 11, a cross-sectional view taken along lines D-D' of example FIG. 10, shows a side cross-sectional view of the common source line. A third impurity area 32, connecting all of the common source lines, and the first impurity area 30, formed between the source contacts 45a, are connected to each other so that the common source line and the source contact 45a can be electrically connected to each other. In other words, although the source contact 45a is not formed over the common source line, but is formed on the same line as the drain contact 45b, the first impurity area 30 can connect the common source line to the source contact 45a.

Figure 12:
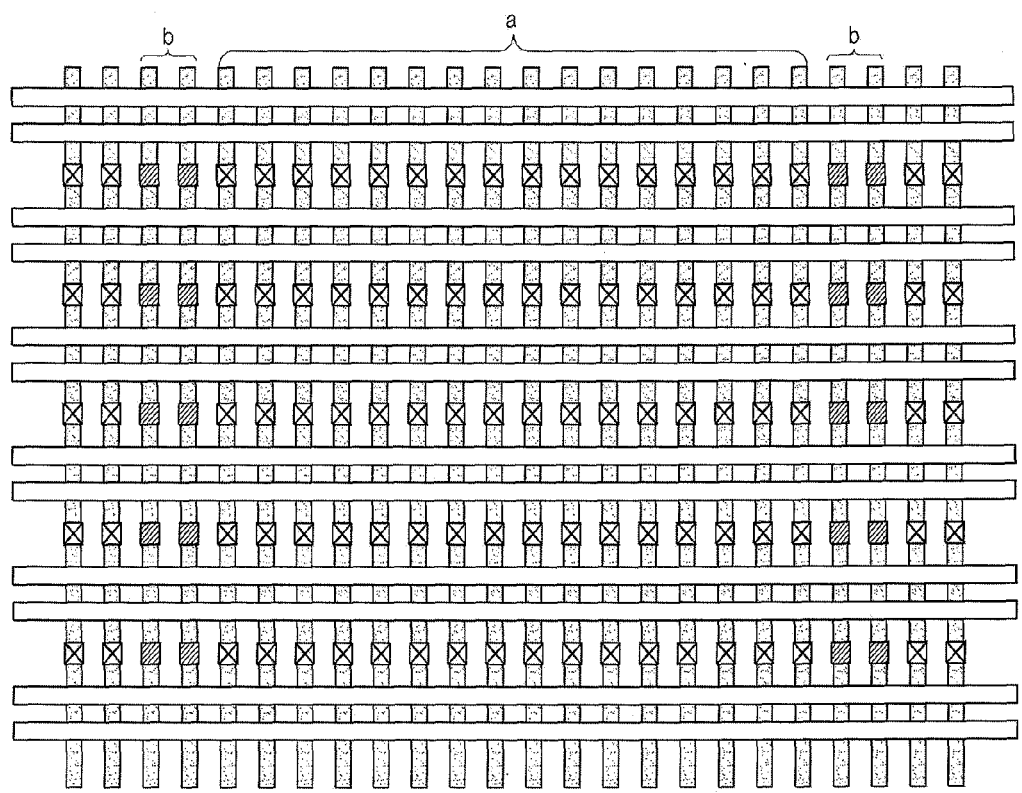

Example FIG. 12 is a plan view of the flash memory device formed in 16-bit. Sixteen active areas are formed in the cell active area a. The source active area b is disposed on both sides of the cell active area a. Although embodiments describe the flash memory device formed in 16-bit, it is not limited thereto. It can also be applied to a 24-bit flash memory device, or a 48-bit flash memory device.

In the manufacturing method of the flash memory device according to embodiments, the source contact area also forms the active areas having the same interval as the bit lines area. The bit lines are formed uniformly, making it possible to stabilize the characteristics of the memory device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a device isolation layer and an active area formed over a semiconductor substrate;
   a memory gate formed over the active area; and
   a control gate formed over the semiconductor substrate including the memory gate, wherein the active area, where a source contact is to be formed, has the same interval spacing as a bit line, and a common source line area, where the source contact is to be formed, has an impurity area connecting neighboring active areas.

2. The apparatus of claim 1, wherein the impurity area is formed below the device isolation layer.

3. The apparatus of claim 1, wherein the impurity area connects at least three active areas.

4. The apparatus of claim 1, wherein the source contact is aligned with a drain contact.

5. The apparatus of claim 1, wherein the control gate is straight and parallel with a neighboring control gate.

6. The apparatus of claim 1, wherein the device isolation layer and the active area formed over a semiconductor substrate, the memory gate formed over the active area, and the control gate form part of a flash memory device.

7. The apparatus of claim 4, wherein the drain contact is formed on the bit line.

8. The apparatus of claim 5, wherein the control gate crosses the active area.

9. A method comprising:
   forming a trench on a semiconductor substrate;
   forming an impurity area in the trench formed between areas where a source contact is to be formed;
   forming an active area by forming a device isolation layer by burying insulating material into the trench; and
   forming a memory gate and a control gate over the device isolation layer, wherein the active area where a source contact is to be formed has the same spacing interval as a bit line, and the impurity area connects the neighboring active areas where the source contact is formed.

10. The method of claim 9, wherein the impurity area is formed below the device isolation layer.

11. The method of claim 9, wherein the impurity area connects at least three active areas.

12. The method of claim 9, wherein the source contact is aligned with a drain contact.

13. The method of claim 9, wherein the wherein the control gate is straight and parallel with a neighboring control gate.

14. The method of claim 9, wherein the control gate crosses the active area.

15. The method of claim 9, wherein the forming the impurity area in the trench comprises:
   opening the trench between the areas where the source contact is to be formed by forming a photoresist pattern over the semiconductor substrate including the trench; and forming the impurity area at the side walls and the bottom surface of the trench by performing a first ion implantation process and a second ion implantation process on the semiconductor substrate.

16. The method of claim 12, wherein the drain contact formed on the bit line.

17. The method of claim 15, wherein the first ion implantation process and the second ion implantation process are performed using V family element at an angle of 0 to 30°.

18. The method of claim 15, wherein the first ion implantation process and the second ion implantation process are performed at an energy of 1 KeV to 100 KeV.

19. The method of claim 15, wherein the first ion implantation process and the second ion implantation process are performed with ion doses ranging from $1 \times 10^{13}$ to $1 \times 10^{16}$ ion/cm$^2$.

20. The method of claim 15, wherein after the first ion implantation process is performed, the semiconductor substrate is rotated, and the second ion implantation process is performed.

* * * * *